United States Patent
Lee

(10) Patent No.: US 7,026,199 B2
(45) Date of Patent: Apr. 11, 2006

(54) TRANSISTOR OF SEMICONDUCTOR DEVICE AND METHOD FOR MANUFACTURING THE SAME

(75) Inventor: Sang Don Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/878,328

(22) Filed: Jun. 29, 2004

(65) Prior Publication Data

US 2005/0095793 A1    May 5, 2005

(30) Foreign Application Priority Data

Oct. 31, 2003    (KR) .................. 10-2003-0076763

(51) Int. Cl.
*H01L 21/00*    (2006.01)

(52) U.S. Cl. .................. 438/157; 438/164; 438/283; 438/525

(58) Field of Classification Search .............. 438/157, 438/164, 283, 284, 296, 302, 525
See application file for complete search history.

(56) References Cited

U.S. PATENT DOCUMENTS 6,867,450 B1 *   3/2005   Kito et al. .................. 257/301
2005/0019993 A1 * 1/2005   Lee et al. .................. 438/157

OTHER PUBLICATIONS

Digh Hisamoto et al., "FinFET-A Self-Aligned Double-Gate MOSFET Scalable to 20 nm", IEEE Transactions on Electron Devices, Dec. 2000, pp. 2320-2325, vol. 47, No. 12.

* cited by examiner

*Primary Examiner*—Trung Dang
(74) *Attorney, Agent, or Firm*—Heller Ehrman LLP

(57) ABSTRACT

Transistor of semiconductor device and method for manufacturing the same are disclosed. The transistor comprises a channel region formed on a sidewall of a silicon fin extruding above a device isolation region. The silicon fin serves as an active region and is shorter in length so as to be spaced apart from an adjacent gate electrode. The width of the channel region is determined by the height of the silicon fin. The source/drain region of the transistor is disposed at an upper surface and the sidewall of the silicon fin to increase the contact region.

16 Claims, 17 Drawing Sheets

TRANSISTOR OF SEMICONDUCTOR DEVICE AND METHOD FOR MANUFACTURING THE SAME

BACKGROUND OF THE INVENTION

1. Field of the Invention

The present invention relates to transistor of semiconductor device and method for manufacturing the same, and in particular to an improved transistor of semiconductor device and method for manufacturing the same wherein a channel region is formed on a sidewall of a: silicon fin extruding above a device isolation region and the contact area is expanded to the sidewall at the end of the silicon fin to prevent short channel effect and provide an increased current driving capability and reduced contact resistance.

2. Description of the Background Art

A DRAM comprises a transistor and a capacitor. As a design rule of the transistor is reduced, a channel length of the cell transistor is also decreased.

A short channel effect occurs due to a decrease in the channel length of the transistor, thereby degrading the characteristic of the transistor.

FIG. 1 is a layout view illustrating a conventional semiconductor device.

As shown in FIG. 1, ends of an active region 200, defined by device isolation region 300, is immediately adjacent to a gate region 400.

FIGS. 2A through 2H are cross-sectional views illustrating a conventional method for manufacturing a transistor of semiconductor device, wherein FIGS. 2A through 2G are cross-sectional views taken along the line A—A of FIG. 1 and FIG. 2H is a cross-sectional view taken along the line B—B of FIG. 2G.

Referring to FIG. 2A, a well (not shown) is formed on a semiconductor substrate 11. Thereafter, a pad oxide film 13 and a pad nitride film 15 are sequentially formed on the semiconductor substrate 11.

Next, the pad nitride film 15, the pad oxide film 13 and a predetermined thickness of the semiconductor substrate 11 are etched via photolithography process using a device isolation mask (not shown) to form a trench 21.

Thereafter, a thermal oxide film 17 is formed on a surface of the trench 21 and a liner nitride film 19 is then formed on the entire surface of the semiconductor substrate 11 including the trench 21.

Referring to FIG. 2B, an oxide film (not shown) at least filling the trench 21 is formed on the entire surface of the semiconductor substrate 11 and then planarized via a CMP process until the pad nitride film 15 is exposed to form a device isolation film 23.

Now referring to FIG. 2C, the pad nitride film 15 and the liner nitride film 19 exposed by the device isolation film 23 are removed by a wet-etch process using a $H_3PO_4$ solution.

Next, ion-implant processes for forming a well and a channel region are performed on the semiconductor substrate 11.

Referring to FIG. 2D, the pad oxide film 13 is removed by a wet-etch process and a gate oxide film 25 is formed on the semiconductor substrate 11.

Next, a polysilicon layer 27 for gate electrode, a barrier metal layer 29 comprising tungsten nitride, a metal layer 31 comprising tungsten, a hard mask nitride film 33 are sequentially formed on the gate oxide film 25.

Referring to FIG. 2E, the hard mask nitride film 33, the metal layer 31, the barrier metal layer 29 and the polysilicon layer 27 are etched via a photolithography process using a gate electrode mask (not shown) to form a gate electrode.

Thereafter, an oxide film 35 is formed on a sidewall of the polysilicon layer 27.

Next, a nitride film 37 having a predetermined thickness is formed on the entire surface of the semiconductor substrate 11 including the gate electrode. Thereafter, a lower insulating film 39 is formed and etched back until the nitride film 37 is exposed.

Referring to FIG. 2F, the lower insulating film 39 and the nitride film 37 are anisotropically etched via a photolithography process using a landing plug contact hole mask to form a nitride spacer and a landing plug contact hole 41.

Thereafter, an impurity is ion-implanted in the semiconductor substrate 11 at the bottom of the landing plug contact hole 41 to form a source/drain region 44.

Referring to FIGS. 2G and 2H, a polysilicon film for landing plug (not shown) filling the landing plug contact hole 41 is formed on the entire surface of the semiconductor substrate 11 and then planarized until the hard mask nitride film 33 is exposed to form a landing plug 43.

In accordance the conventional method described above, as the design rule is reduced, the channel length is decreased, resulting in short channel effect. To overcome this problem, a method of increasing impurity concentration of the channel region has been proposed. However, an increase in the impurity concentration results in increase in electric field and leakage current, which deteriorate refresh time characteristic of the device.

The decrease in the channel length due to the reduction of the design rule degrades current driving capability of the device.

The reduction of the design rule also decrease the contact area between the source/drain region of the cell transistor and the landing plug, resulting in increase in contact resistance.

FIGS. 3 is a layout view illustrating another conventional semiconductor device, wherein a fin type field effect transistor formed on a SOI (Silicon-On-Insulator) wafer is shown.

Referring to FIG. 3, a silicon fin region 600 connecting source/drain regions 500 is used as a channel and a gate electrode region 700 is disposed on the silicon fin region 600.

FIGS. 4A through 4F are cross-sectional views illustrating another conventional method for manufacturing a transistor of semiconductor device shown in FIG. 3, wherein FIGS. 4A through 4E are cross-sectional views taken along the line A—A of FIG. 3 and FIG. 4F is a cross-sectional view taken along the line B—B of FIG. 3.

Referring to FIG. 4A, a first nitride film (not shown) and a first oxide film (not shown) are sequentially formed on a SOI wafer including a stacked structure of a buried oxide film 53 and a silicon body 55. The first oxide film and the first nitride film are patterned to form a first oxide film pattern 59 and a first nitride film pattern 57.

Referring to FIG. 4B, the silicon body 55 is etched using the first oxide film pattern 59 as an etching mask to form a silicon fin 61. The silicon fin 61 serves as a channel of the transistor.

Referring to FIG. 4C, a polysilicon film 63 and a second oxide film 65 are sequentially formed on the entire surface of the SOI wafer. The polysilicon film 63 is used as a source/drain region of the transistor.

Referring to FIG. 4D, the second oxide film 65 and the polysilicon film 63 are patterned to form a recess 69 defining a gate region.

Thereafter, a third oxide film (not shown) is deposited on the entire surface and then anisotropically etched to form an oxide film spacer 67 on a sidewall of the recess 69. The anisotropic etching process is an over-etch process wherein the first oxide film pattern 59 and the first nitride film pattern 57 exposed by the oxide film spacer 67 are etched to expose the silicon fin 61 and a predetermined thickness of the buried oxide film 53 is additionally etched.

Referring to FIGS. 4E and 4F, a gate oxide film 71 is formed on the exposed portion of the silicon fin 61 and a gate electrode 73 is then formed by filling the recess 69 using a polycrystalline SiGe layer.

In accordance the conventional method described above, the short channel effect can be reduced. However, the production cost of the device is increased due to the use of SOI wafer. In addition, the refresh characteristic of the device is deteriorated.

SUMMARY OF THE INVENTION

Accordingly, it is an object of the present invention to provide transistor of semiconductor device and method for manufacturing the same wherein a channel region is formed on a sidewall of a silicon fin extruding above a device isolation region and the contact area is expanded to the sidewall at the end of the silicon fin to prevent short channel effect and provide an increased current driving capability and reduced contact resistance.

In order to achieve the above-described object of the invention, there is provided a method for manufacturing the transistor of semiconductor device comprising the steps of: (a) forming a trench type device isolation film defining a I-type active region on a semiconductor substrate having a stacked structure of a pad oxide film, a pad nitride film thereon; (b) etching a predetermined thickness of the device isolation film to form a silicon fin extruding above the device isolation film; (c) tilt implanting an impurity on a sidewall of the silicon fin to form a channel region; (d) forming a gate oxide film on the sidewall of the silicon fin; (e) forming a planarized polysilicon layer for gate electrode on the semiconductor substrate; (f) patterning the polysilicon layer and the pad nitride film to form a gate electrode; (g) forming a lower insulating film including a landing plug contact hole exposing a portion of the pad oxide film and a portion of the gate oxide film; (h) performing an ion implant process to form an impurity implanted region at a bottom of the landing plug contact hole; (i) etching the exposed portion of the pad oxide film to expose the silicon fin; and (j) forming a landing plug filling the landing plug contact hole.

In order to achieve the above-described object of the invention, there is also provided a transistor of semiconductor device comprising: an I-type active region defined by a trench type device isolation film, wherein the I-type active region includes a silicon fin extrudes above the trench type device isolation film; a gate oxide film disposed on a sidewall of the silicon fin; a set of gate electrodes having a planarized top surface, wherein the gate electrode extends across and perpendicular to the I-type active region; a pad insulating film disposed at an interface of an upper surface of the silicon fin and a lower surface of the gate electrode; a source/drain region disposed on the silicon fin between the gate electrodes and at both sides of the gate electrode; a channel region disposed at the sidewall of the silicon fin under the gate oxide film and between the gate electrodes.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A transistor of semiconductor device and method for manufacturing the same in accordance with a preferred embodiment of the present invention will now be described in detail with reference to the accompanying drawings.

Figure 1:
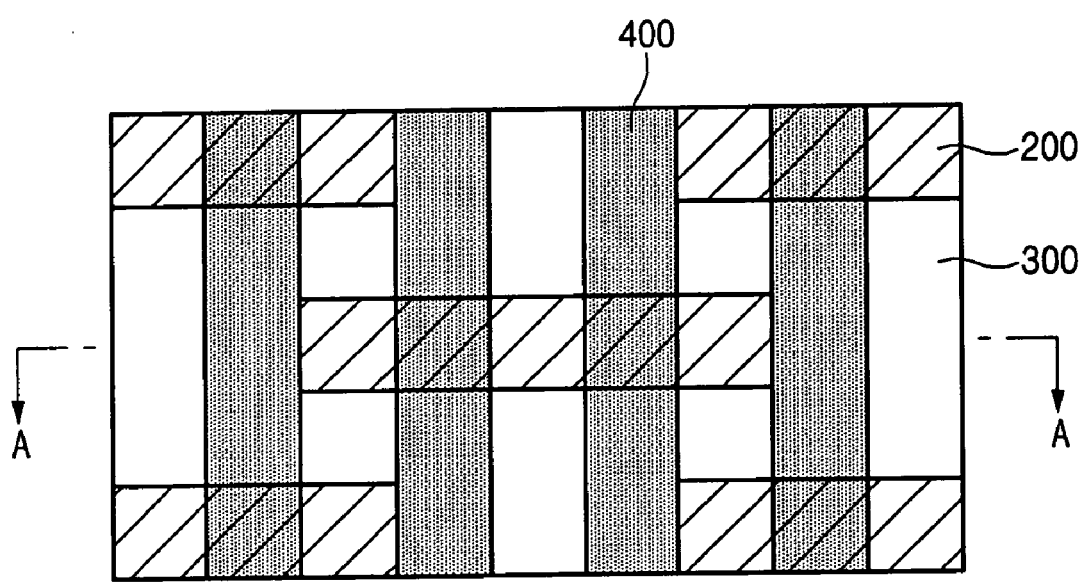
FIG. 1 is a layout view illustrating a conventional semiconductor device.
Figure 2A:
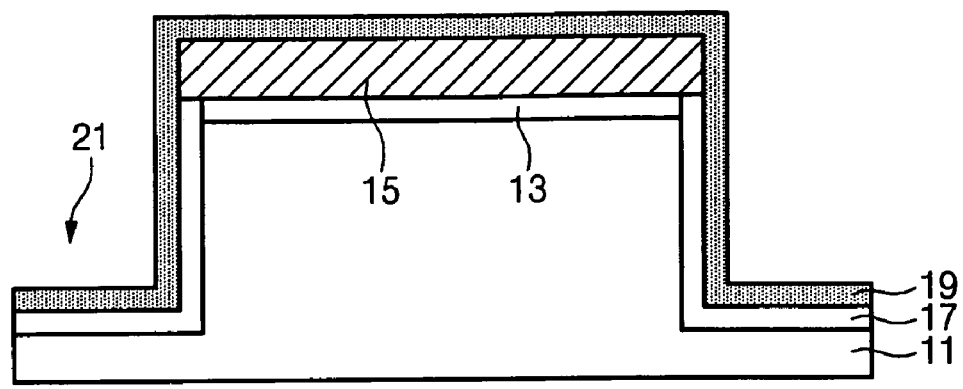
FIGS. 2A through 2H are cross-sectional views illustrating a conventional method for manufacturing a transistor of semiconductor device.
Figure 2B:
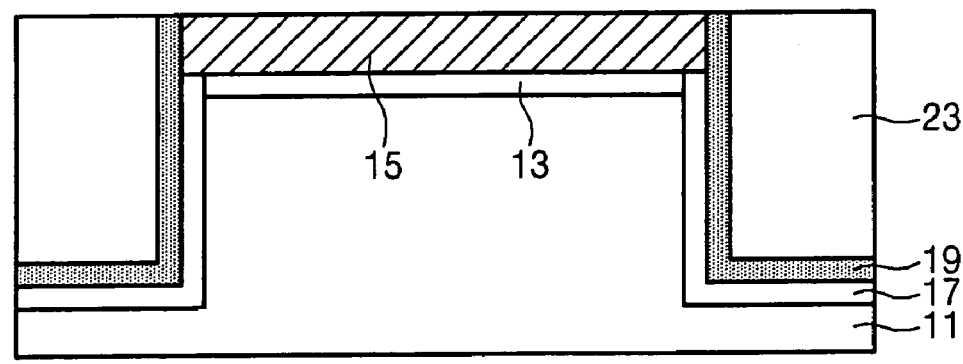
Figure 2C:
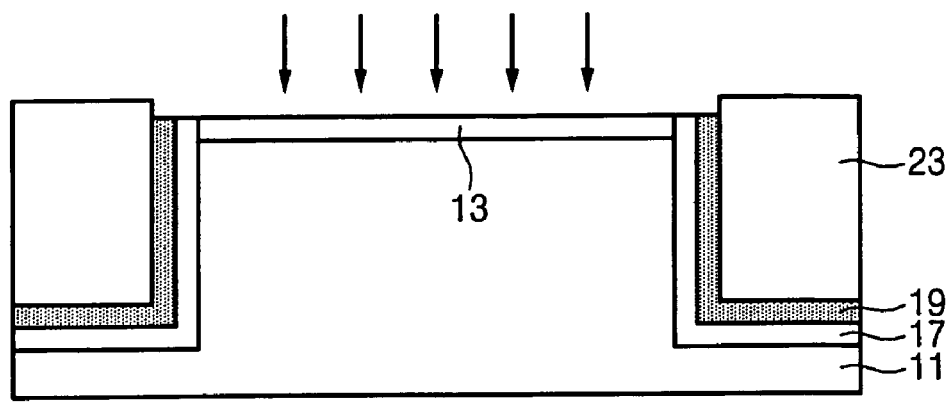
Figure 2D:
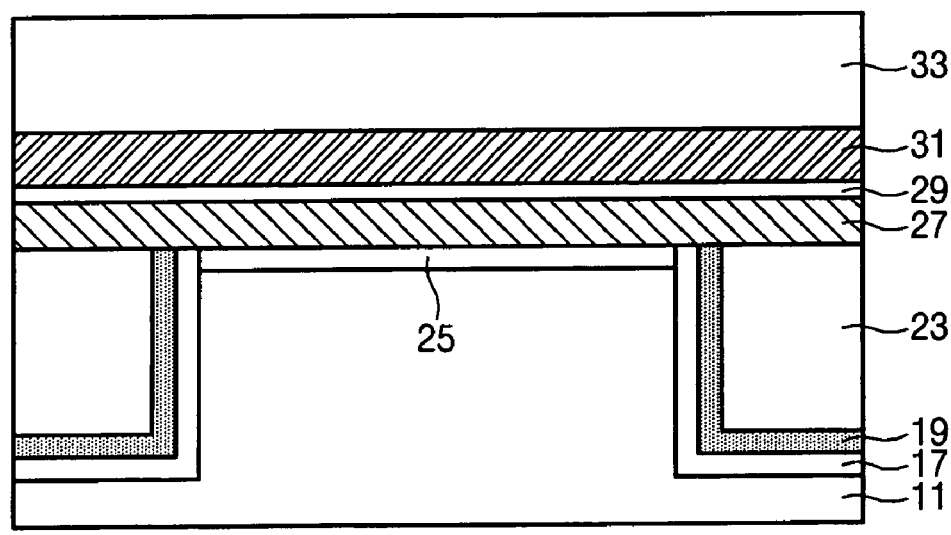
Figure 2E:
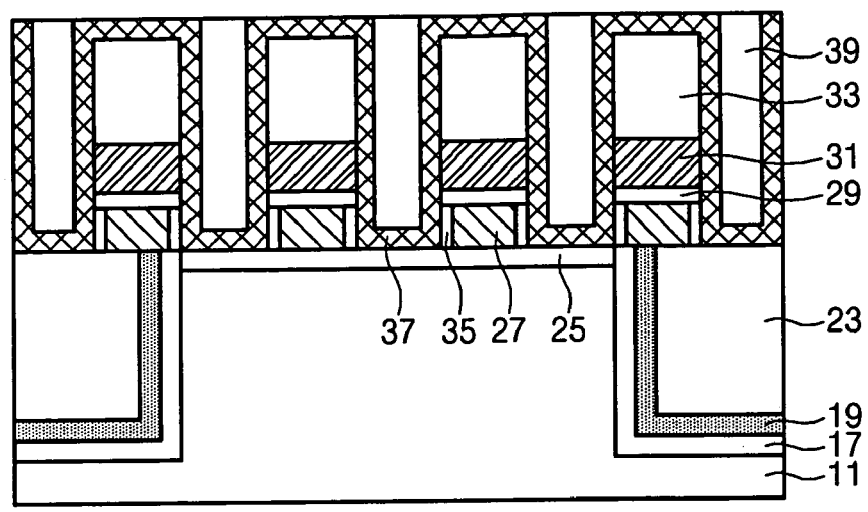
Figure 2F:
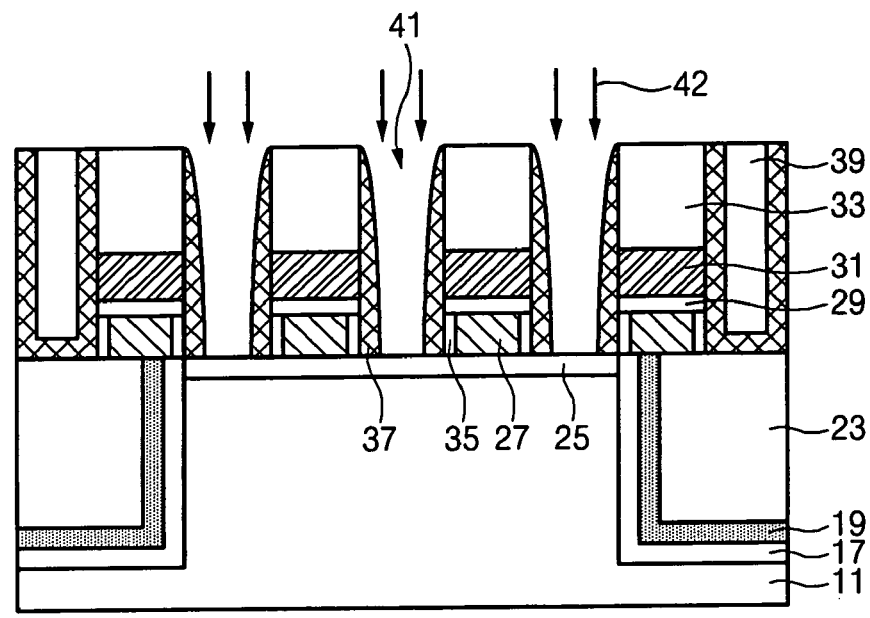
Figure 2G:
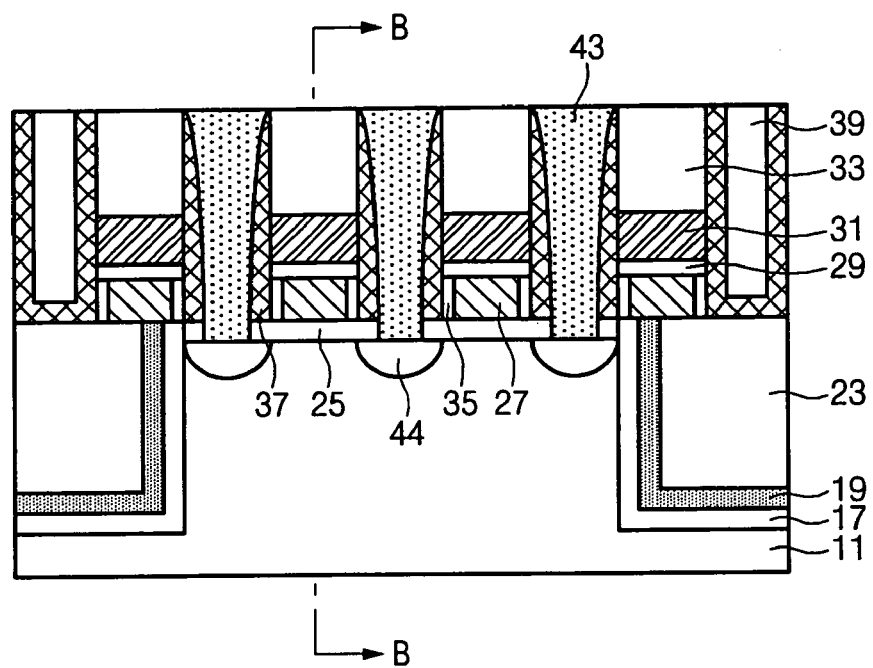
Figure 2H:
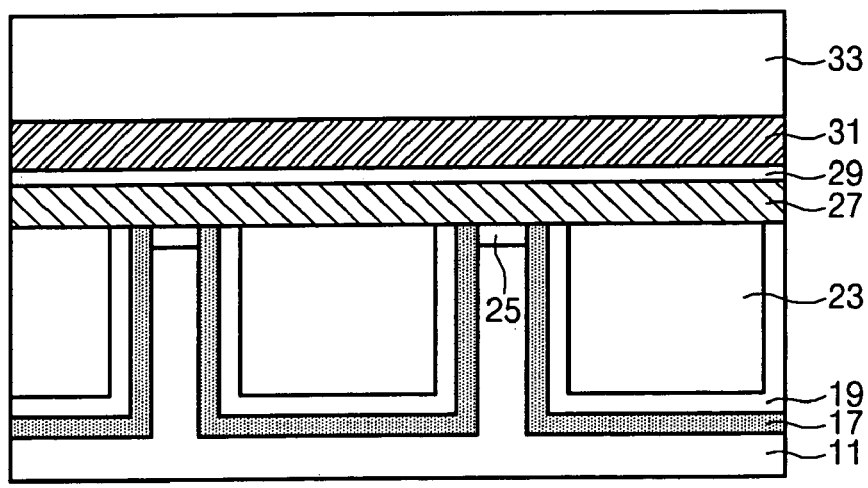
Figure 3:
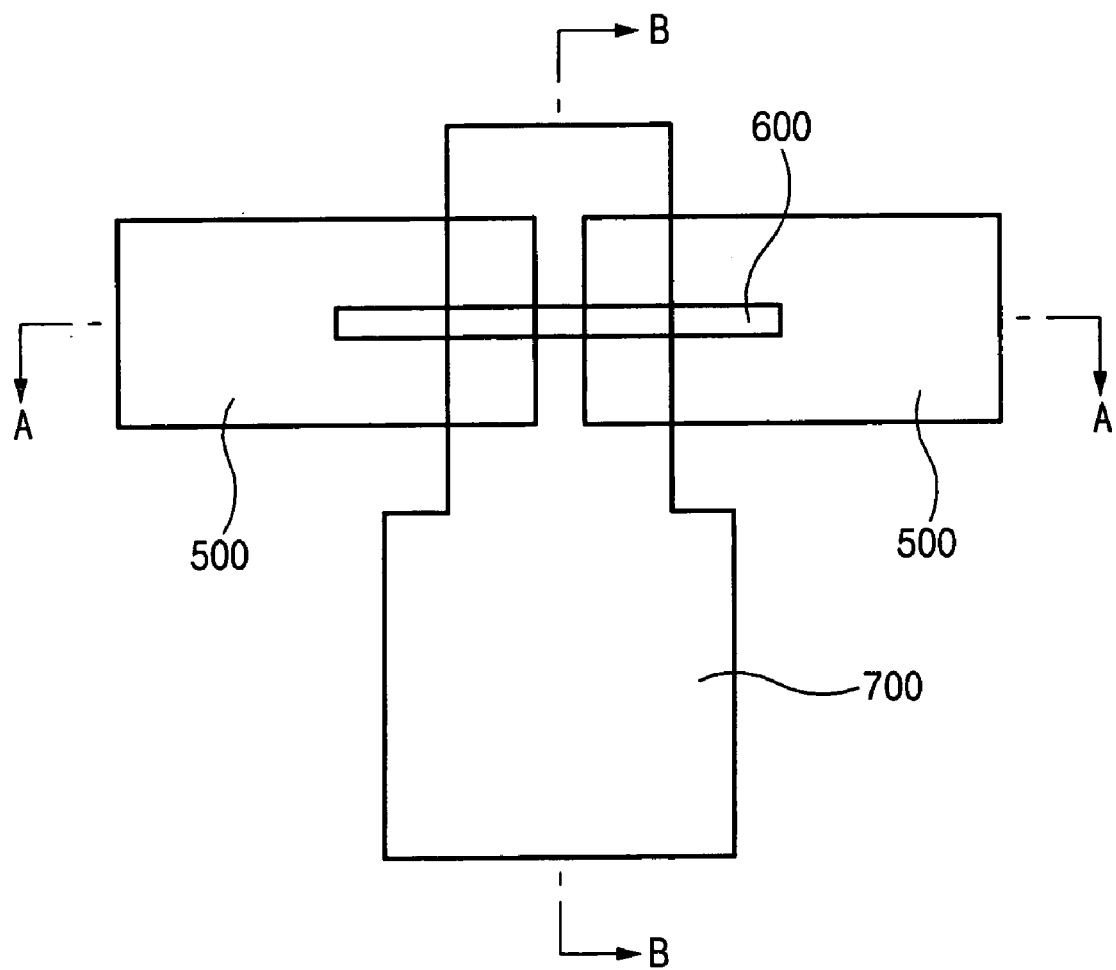
FIG. 3 is a layout view illustrating another conventional semiconductor device.
Figure 4A:
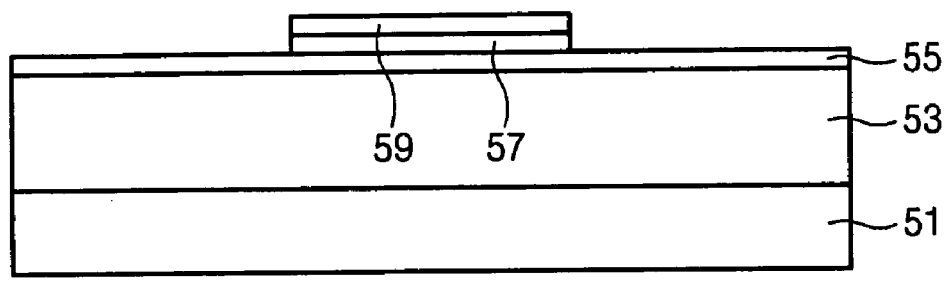
FIGS. 4A through 4F are cross-sectional views illustrating another conventional method for manufacturing a transistor of semiconductor device shown in FIG. 3.
Figure 4B:
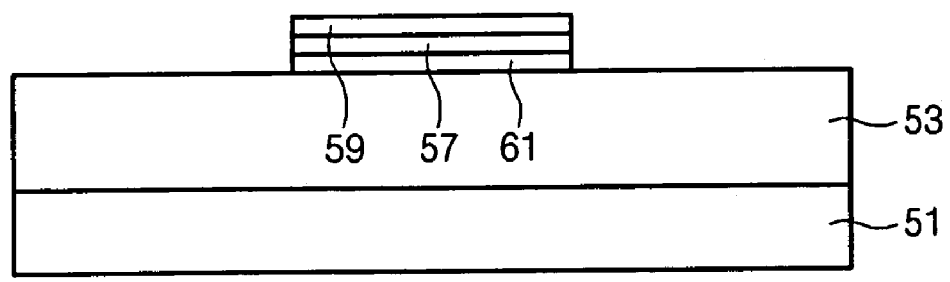
Figure 4C:
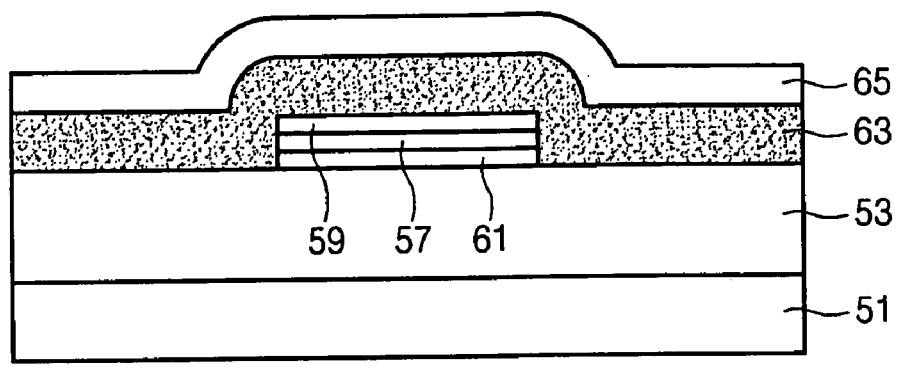
Figure 4D:
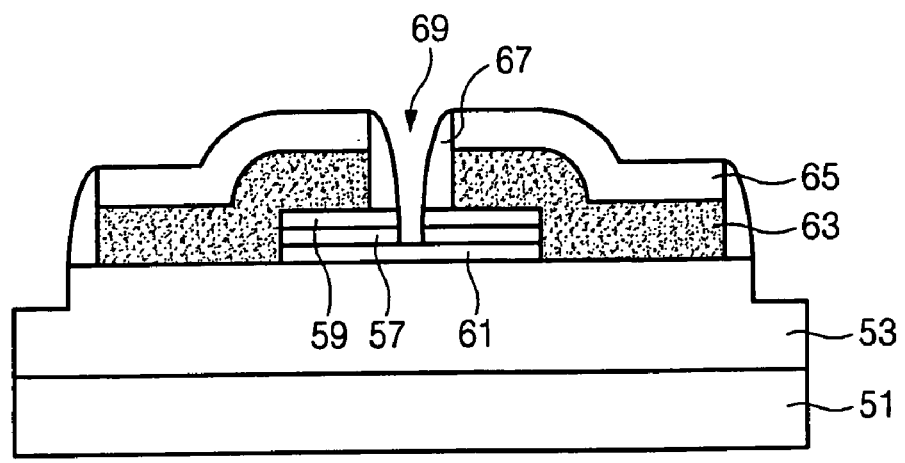
Figure 4E:
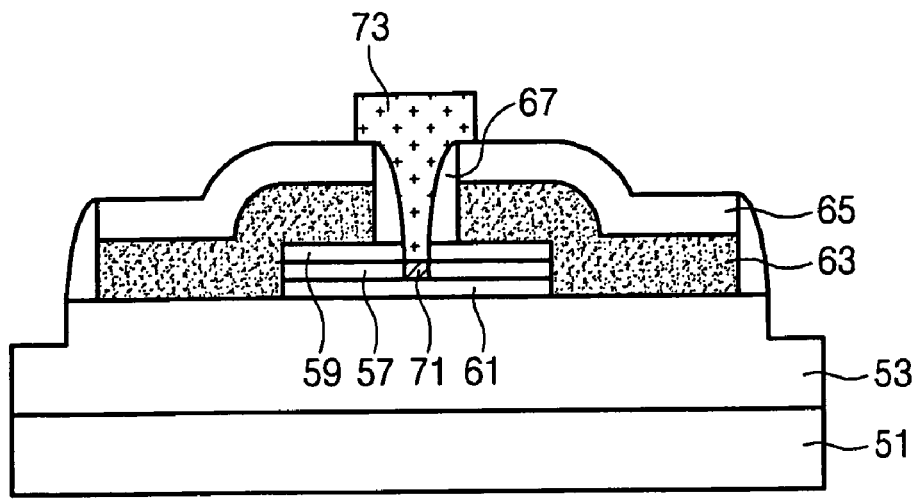
Figure 4F:
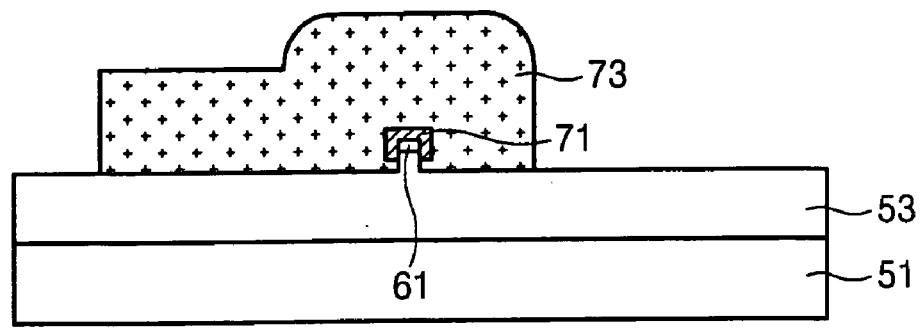
Figure 5:
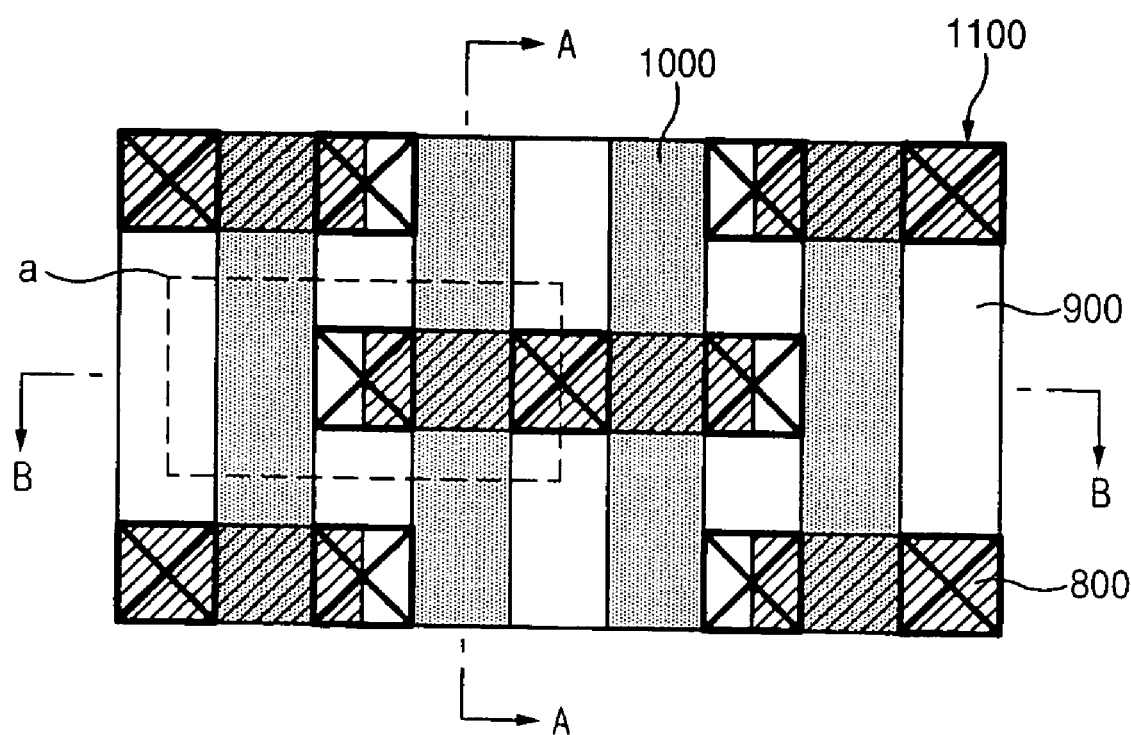
FIGS. 5 is a layout view illustrating a semiconductor device in accordance with the present invention.

FIG. 5 is a layout view illustrating a semiconductor device in accordance with the present invention.

Referring to FIG. 5, the semiconductor device comprises a device isolation region 900 for defining an active region 800. The active region 800 comprises a contact region 1100 including a source/drain region, and an end portion of the active region 800 in its lengthwise direction is spaced apart from a gate region 1000. The space between active region 800 and the gate region 1000 prevents short between a gate electrode formed in the gate region 1000 and the active region 800 including a silicon fin extruding above the device isolation region 900. In addition, a contact area of a landing plug is increased to improve contact characteristic because the landing plug contacts a sidewall of the extruding silicon fin of the active region 800.

Figure 6:
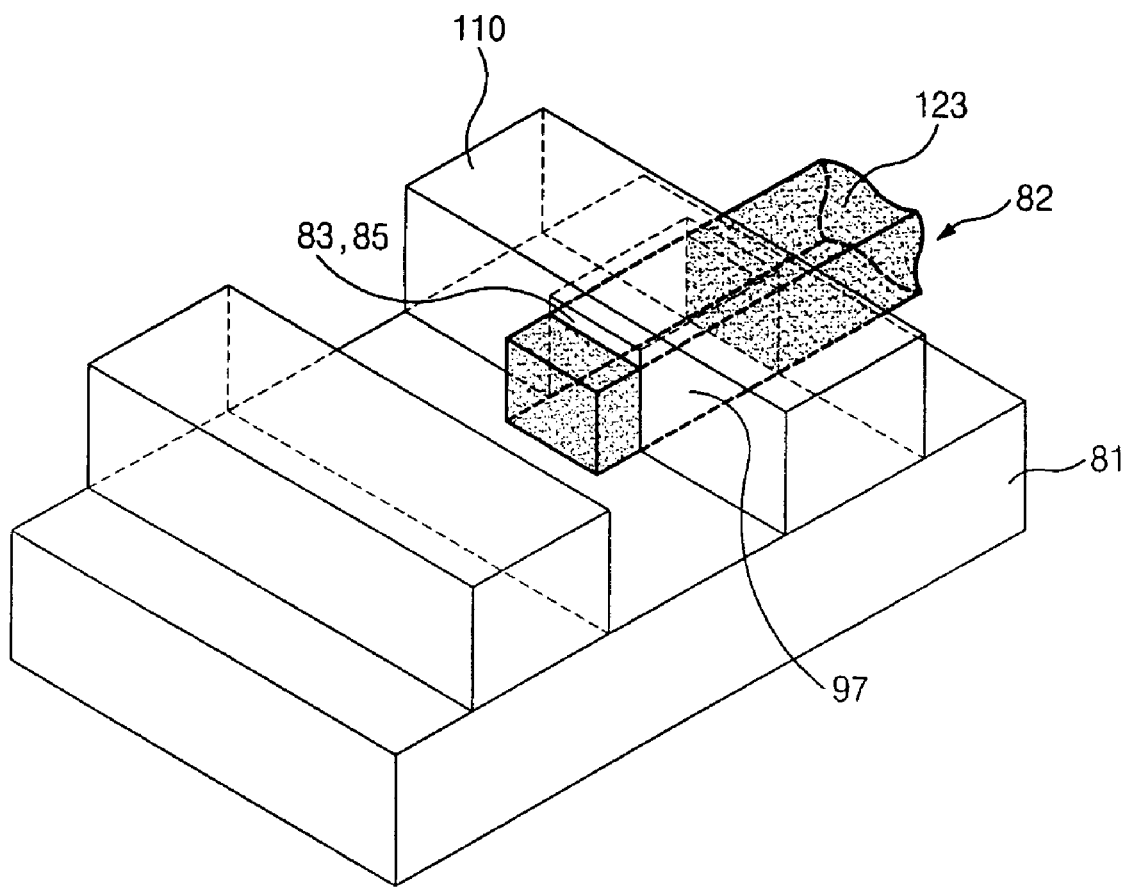
FIG. 6 is a perspective view illustrating a transistor of semiconductor device in accordance with a first preferred embodiment of the present invention.

FIG. 6 is a perspective view illustrating a transistor of semiconductor device in accordance with an embodiment of the present invention, wherein an enlarged view of region 'a' in FIG. 5 is illustrated.

Only a silicon fin 82 of the active region formed in a semiconductor substrate 81, a channel region 97, a source/drain region 123, a pad insulating film 83 and 85 and a gate electrode 110 are shown in FIG. 6 for simplicity. A detailed cross-sectional view of the transistor of semiconductor device in accordance with the present invention is shown in FIG. 7G.

The semiconductor device shown in FIG. 6 comprises a semiconductor substrate 81 and an I-type active region including a silicon fin 82. The I-type active region is defined by a trench type device isolation film. The silicon fin 82 extrudes above the trench type device isolation film and is spaced apart from adjacent gate electrodes. A set of gate electrodes 110 having a planarized top surface is disposed so that the gate electrodes 110 extend across and perpendicular to the silicon fin 82.

A gate oxide film (not shown) is disposed on a sidewall of the silicon fin 82, and a channel region 97 is disposed at the sidewall of the silicon fin 82 under the gate oxide film and between the set gate electrodes 110. Because the gate electrodes 110 contact an upper surface and the sidewall of the silicon fin 82, the width of the channel region 97 is two times the height of the silicon fin 82.

Still referring to FIG. 6, the semiconductor device comprises a pad insulating film disposed at an interface of an upper surface of the silicon fin 82 and a lower surface of the gate electrode 110. The pad insulating film includes a stacked structure of a pad oxide film 83 and a pad nitride film 85. The pad insulating film prevents the upper of the silicon fin 82 from serving as a channel region.

The semiconductor device further comprises a source/drain region 123 disposed on the silicon fin 82 between the gate electrodes 110 and at both sides of the gate electrodes 110.

Figure 7A:
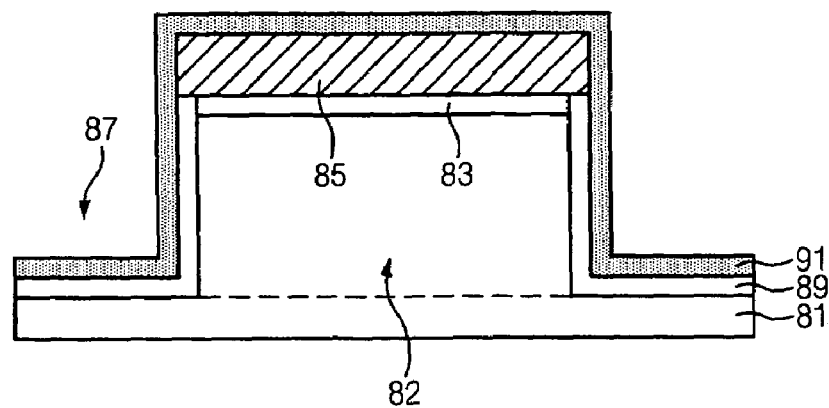
FIGS. 7A through 7H are cross-sectional views illustrating method for manufacturing transistor of semiconductor device in accordance with the first preferred embodiment of the present invention.
Figure 7B:
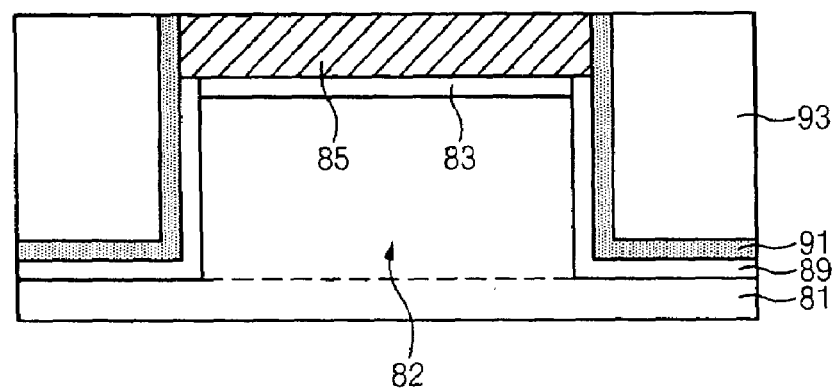
Figure 7C:
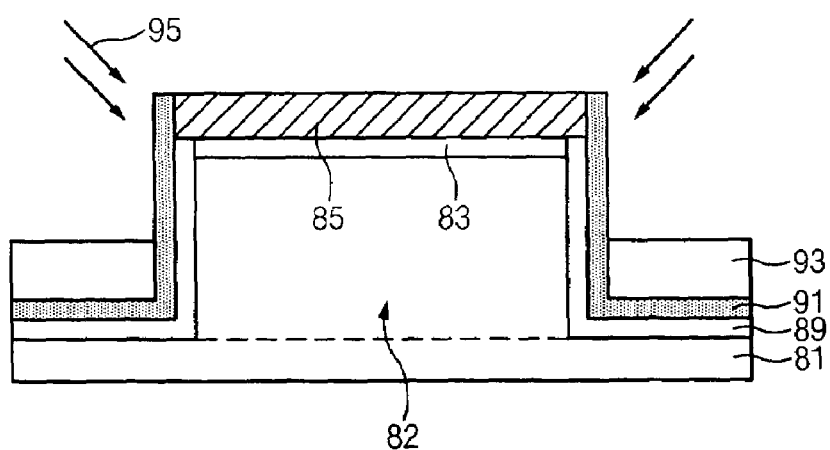
Figure 7D:
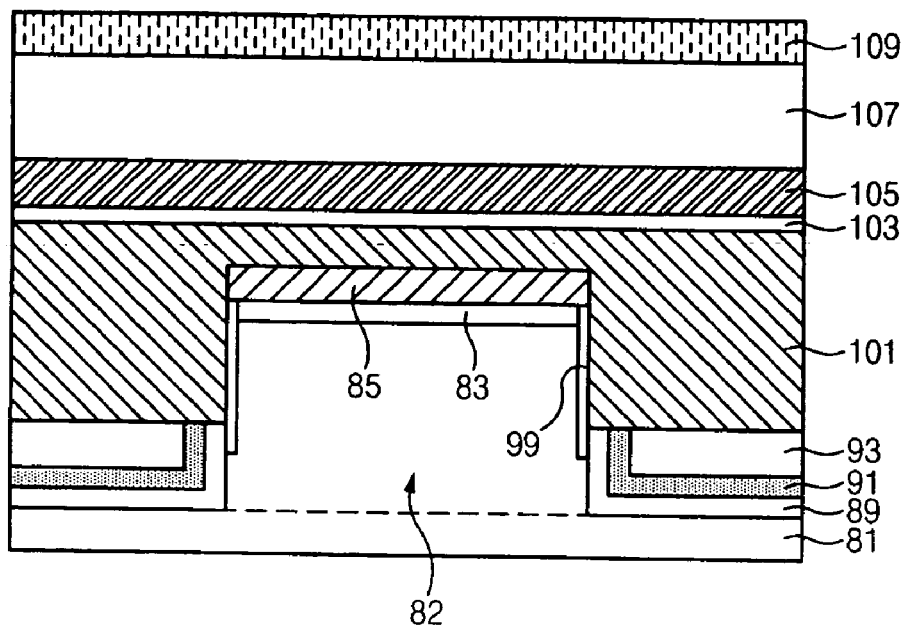
Figure 7E:
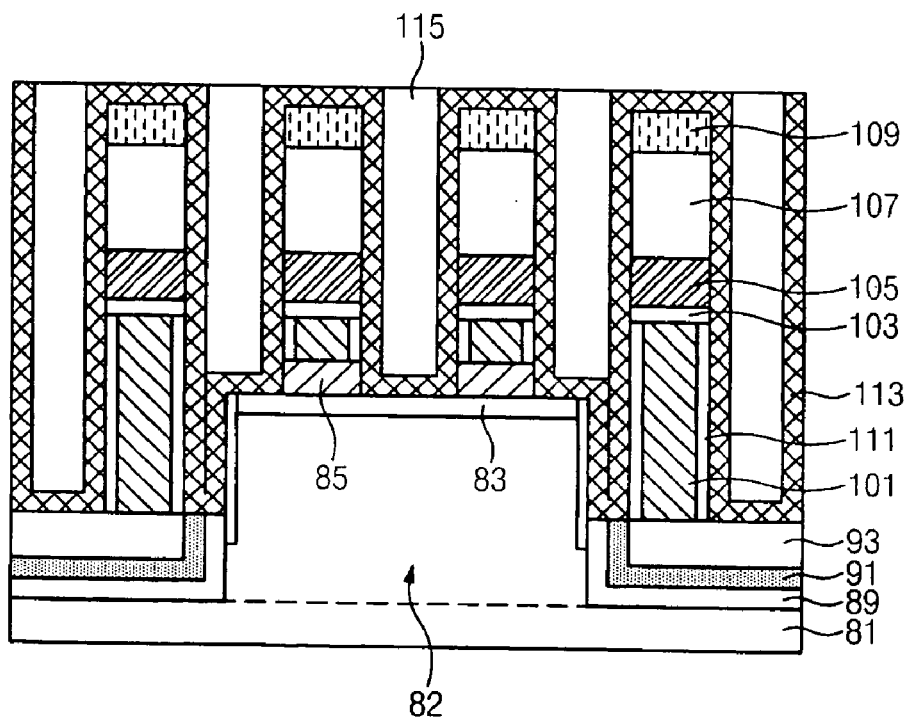
Figure 7F:
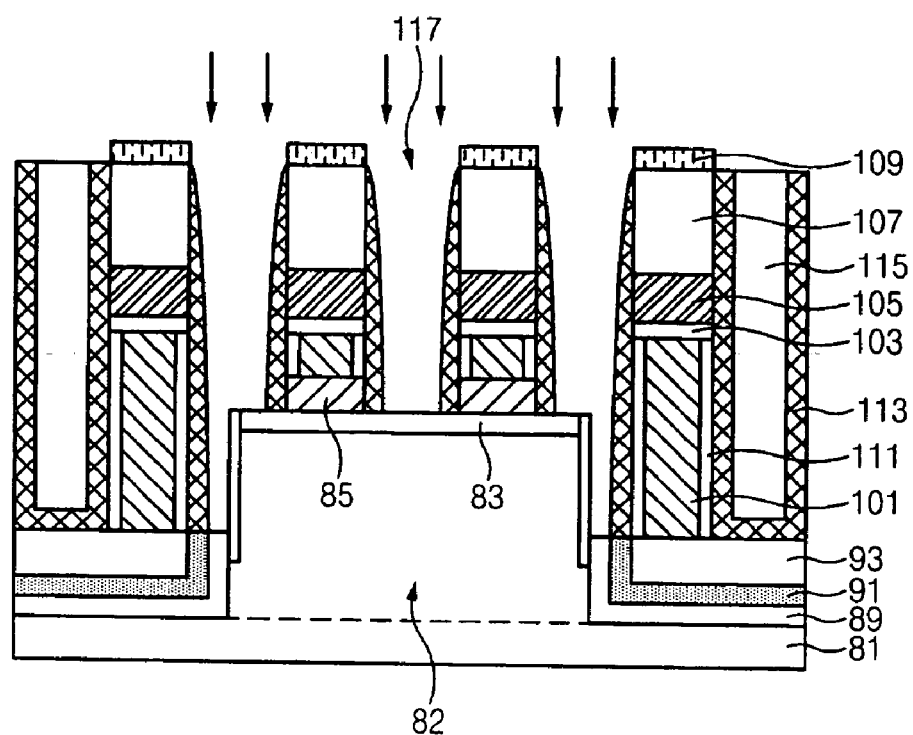
Figure 7G:
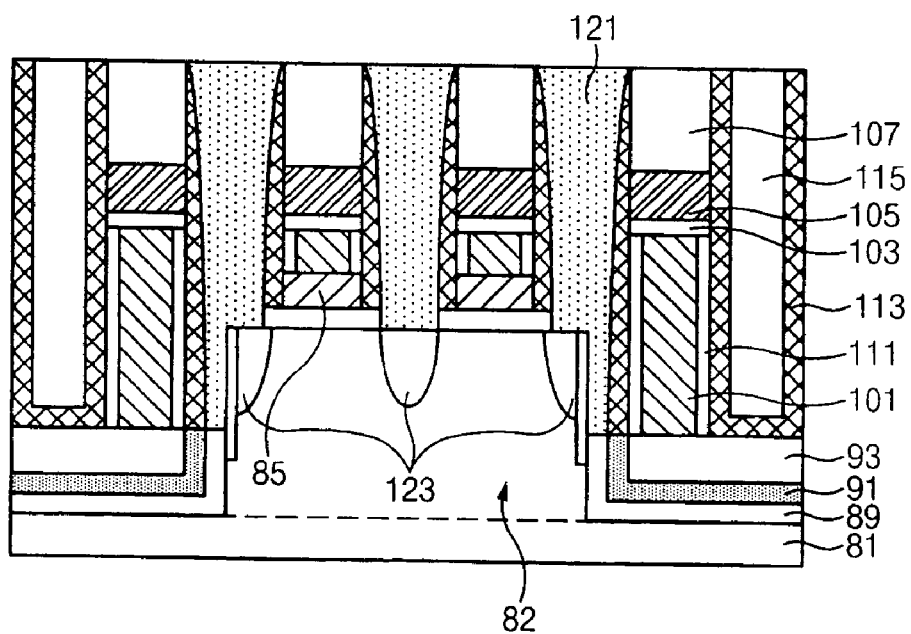
Figure 7H:
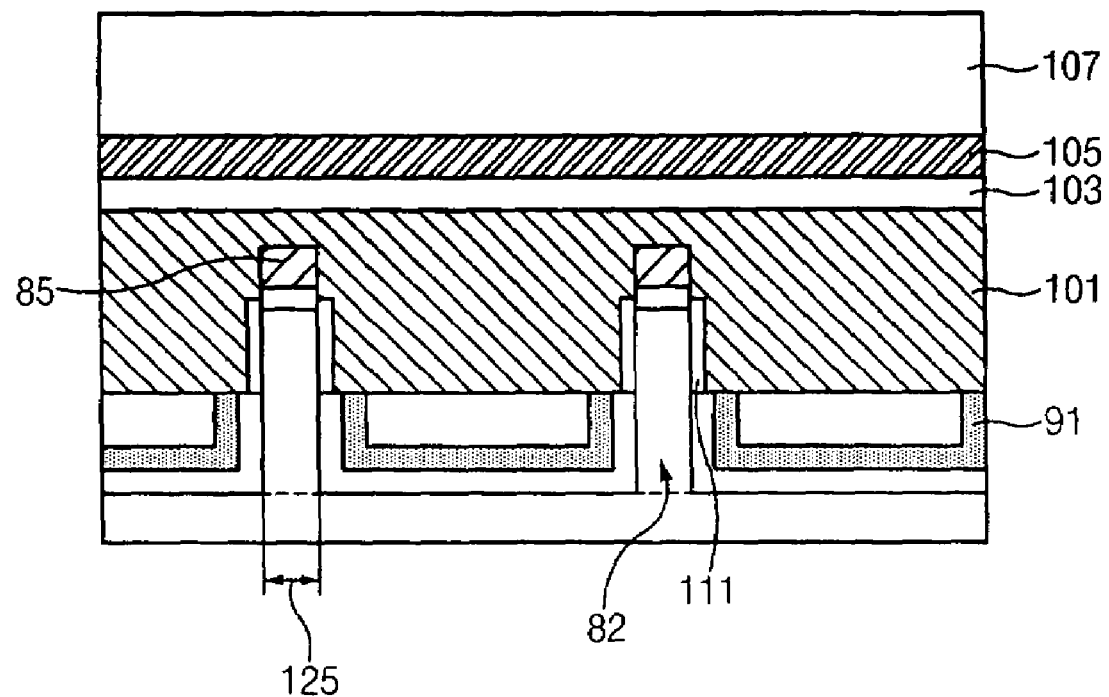

FIGS. 7A through 7H are cross-sectional views illustrating a method for manufacturing transistor of semiconductor device in accordance with the first preferred embodiment of the present invention, wherein FIGS. 7A through 7G are cross-sectional views taken along the line A—A of FIG. 5 and FIG. 7H is a cross-sectional view taken along the line B—B of FIG. 5.

Referring to FIG. 7A, a well (not shown) is formed on a semiconductor substrate 81. Thereafter, a pad insulating film comprising a stacked structure of a pad oxide film 83 and a pad nitride film 85 is formed on a semiconductor substrate 81. Preferably, the pad oxide film 83 has a thickness ranging from 50 to 200 Å, and the pad nitride film 85 has a thickness ranging from 100 to 400 Å.

Thereafter, an exposure and development process using an exposure mask (not shown) having a mask film pattern (not shown) for defining the I-type active region is performed. The mask film pattern defining the I-type active region is shorter than a conventional one so that the I-type active region is spaced apart from a region where the gate electrode is to be formed. For example, when minimum line width is F, a typical length of an active region is 5F. However, the active region in accordance with the present invention is shorter than 5F so that it is spaced apart from adjacent gate electrodes. A photoresist film pattern (not shown) for defining the shorter I-type active region is formed on the semiconductor substrate 81 by the exposure and development process.

The stacked structure of the pad oxide film 83 and the pad nitride film 85 and a predetermined thickness of the semiconductor substrate 81 are then etched using the photoresist film pattern as an etching mask to form a trench 87 for device isolation film.

Next, a thermal oxide film 89 is preferably formed on a surface of the trench 87. A liner nitride film 91 is then formed on the entire surface of the semiconductor substrate 81 including the trench 87. The active region is surrounded by the thermal oxide film 89 and the liner nitride film 91.

Now referring to FIG. 7B, an oxide film (not shown) at least filling the trench 87 is formed on the entire surface of the semiconductor substrate 81 and then planarized until the pad nitride film 85 is exposed to form a device isolation film 93. Preferably, the planarization process comprises a chemical mechanical polishing ('CMP') process.

As described above, the I-type active region may be formed using a special exposure mask designed to have a mask film pattern for shorter active region. However, the I-type active region having a shorter length may be also formed according to two methods described below without using the special mask.

Figure 8A:
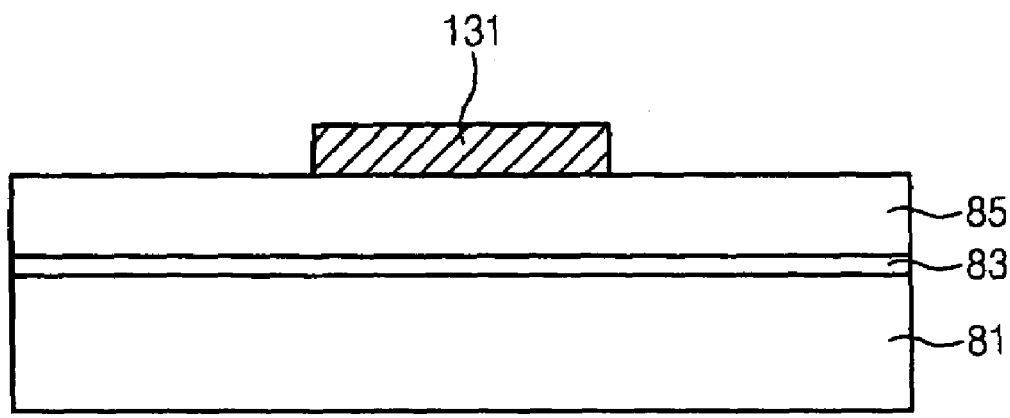
FIGS. 8A and 8B are a cross-sectional view and a plane view respectively, illustrating a method for manufacturing an active region having a shorter length than a conventional one in accordance with a second preferred embodiment of the present invention.
Figure 8B:
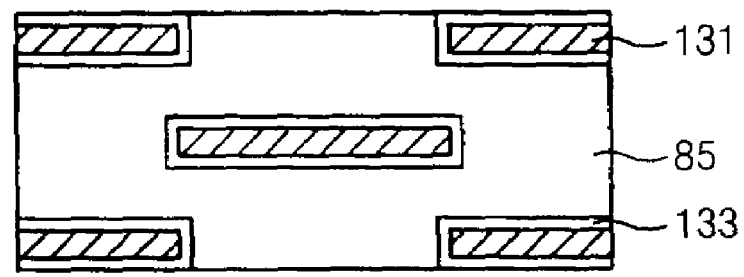

FIGS. 8A and 8B are a cross-sectional view and a plane view respectively, illustrating a method for manufacturing the active region having a shorter length than a conventional one in accordance with a second preferred embodiment of the present invention.

Referring to FIGS. 8A and 8B, a stacked structure of a pad oxide film 83 and a pad nitride film 85 is formed on the semiconductor substrate 81. Thereafter, a CVD oxide film (not shown) is formed on the pad nitride film 85 and then etched via a photolithography process using a device isolation film mask (not shown) to form a CVD oxide film pattern 131. The device isolation mask is a conventional exposure mask for defining an active region and device isolation region and is not required to have a mask film pattern for defining a shorter active region.

Next, the surface of the CVD oxide film pattern 131 is wet-etched so that the length of the CVD oxide film pattern 131 is shortened by the thickness of wet-etched region 133.

The pad nitride film 85, the pad oxide film 83 and the semiconductor substrate 81 are etched using the wet-etched CVD oxide film pattern 131 as an etching mask to form the trench 87 shown in FIG. 7A. A trench type device isolation film 93 shown in FIG. 7B is then formed by filling the trench.

Figure 9:
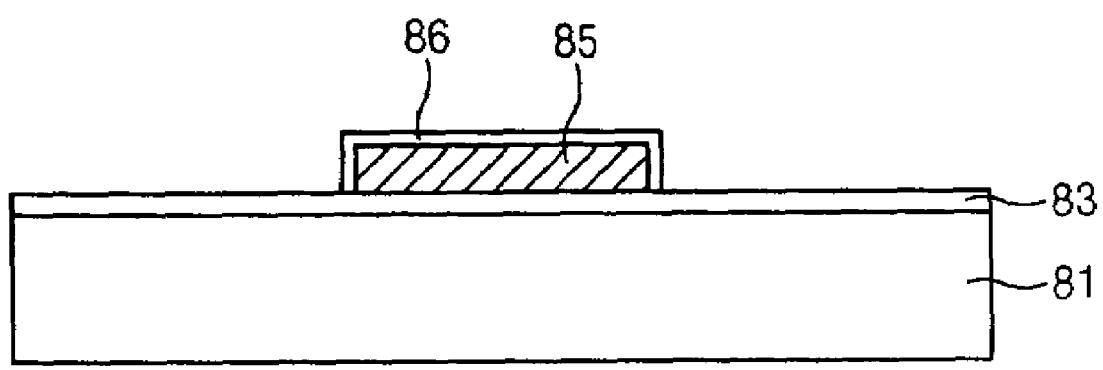
FIG. 9 is a cross-sectional diagram illustrating a method for manufacturing an active region having a shorter length than a conventional one in accordance with a third preferred embodiment of the present invention.

FIG. 9 is a cross-sectional diagram illustrating a method for manufacturing an active region having a shorter length than a conventional one in accordance with a third preferred embodiment of the present invention.

Referring to FIG. 9, a stacked structure of a pad oxide film 83 and a pad nitride film 85 is formed on the semiconductor substrate 81. Thereafter, the pad nitride film 85 is etched via a photolithography process using a device isolation film mask to form a pad nitride film pattern 85. The device isolation mask is a conventional exposure mask, for example the mask used in the second embodiment shown in FIGS. 8A and 8B.

Next, the surface of pad nitride film pattern 85 is wet-etched. The pad nitride film 85, the pad oxide film 83 and the semiconductor substrate 81 are then etched using the wet-etched CVD oxide film pattern 131 as an etching mask to form a trench 87 shown in FIG. 7A. Thereafter, a trench type device isolation film 93 shown in FIG. 7B is then formed by filling the trench 87.

Now referring to FIG. 7C, a predetermined thickness of the device isolation film 93 is etched to form so-called "a silicon fin" 82. The silicon fin 82 is a portion of the active region extruding above the device isolation film 93. The liner nitride film 91 formed on a sidewall of the silicon fin 82 is exposed after the etching process of the device isolation film 93.

Thereafter, an impurity 95 is tilt-implanted on the sidewall of the silicon fin 82 to form a channel region denoted as '97' in FIG. 6. The tilt-implant process is preferably performed at an impurity concentration ranging from 10E10 to 10E19/cm³.

Now referring to FIG. 7D, the liner nitride film 91 and the thermal oxide film 89 on the sidewall of the silicon fin 82 are removed to expose the sidewall of the silicon fin 82

Thereafter, a gate oxide film 99 is formed on the exposed portion of the sidewall of the silicon fin 82. The gate oxide film 99 preferably has a thickness ranging from 50 to 100 Å.

Next, a planarized polysilicon layer 101 for gate electrode is formed on the entire surface of the semiconductor substrate 81, thereby surrounding the top surface and the sidewall of the silicon fin 82. A barrier metal layer 103, a metal layer 105, a hard mask nitride film 107 and a hard mask oxide film 109 are sequentially formed on the polysilicon layer 101.

Referring to FIG. 7E, the hard mask oxide film 109, the hard mask nitride film 107, the metal layer 105, the barrier metal layer 103 and the polysilicon layer 101 are etched via a photolithography process using a gate electrode mask (not shown) to form a gate electrode (denoted as reference numeral 110 in FIG. 6) perpendicular to the lengthwise direction of the active region. A portion of the gate electrode 110 on the active region comprises a stacked structure of a pad nitride film pattern 85, the polysilicon layer 101, the barrier metal layer 103, the metal layer 105, the hard mask nitride film 107 and the hard mask oxide film 109. A portion of the gate electrode 110 on the device isolation film 93 comprises a stacked structure of the polysilicon layer 101, the barrier metal layer 103, the metal layer 105, the hard mask nitride film 107 and the hard mask oxide film 109.

Next, an oxide film 111 is formed on a surface of the polysilicon layer 101. A nitride film 113 having a predetermined thickness is formed on the entire surface of the semiconductor substrate 91 including the gate electrode 110.

Thereafter, an insulating film (not shown) such as a BPSG (borophospho silicate glass) film having a high step coverage is formed and then etched back until the nitride film 113 is exposed to form a lower insulating film 115.

Referring to FIG. 7F, the lower insulating film 115 and the nitride film 113 are anisotropically etched via an SAC process to form a self-aligning landing plug contact hole 117 exposing pad oxide film 83 and a portion of the gate oxide film 99 and a spacer at a sidewall of the gate electrode 110. Preferably, the anisotropic etching process is performed to be an over-etch process such that the nitride film 113 on the hard mask oxide film 109 and the gate oxide film 99 is completely removed.

Thereafter, an impurity for LDD region is ion-implanted in the semiconductor substrate 81 at the bottom of the landing plug contact hole 117 to form a LDD region. Preferably, a halo impurity implant process may be performed in addition to the LDD region ion-implant process.

Referring to FIG. 7G, a portion of the pad oxide film 83 exposed through the spacer and a portion of the gate oxide film 99 on the sidewall of the pad oxide film 83 are removed preferably via a wet-etch process.

Next, a polysilicon film for landing plug (not shown) filling the landing plug contact hole 117 is formed on the entire surface of the semiconductor substrate 81 and then planarized until the hard mask nitride film 107 is exposed to form a landing plug 121. The planarization process preferably comprises a CMP process or an etch-back process.

The impurity included in the landing plug 121 then diffuses into the silicon fin 82 to form a source/drain region 123.

FIG. 7H is a cross-sectional view of the transistor shown in FIG. 7G taken along the line B—B of FIG. 5.

Referring to FIG. 7H, the channel width of the transistor is two times the height of the extruding silicon fin 82. When compared to a conventional transistor wherein a line width of the active region corresponds to the width of the channel region, the transistor of the present invention provides a larger channel width for an increased current driving capability and prevention of short channel effect.

As discussed earlier, in accordance with the present invention, the transistor of semiconductor device and the methods for manufacturing the same prevents short channel effect and provides an increased current driving capability and reduced contact resistance by forming the channel region on the sidewall of the silicon fin extruding above the device isolation region and by expanding the contact area to the sidewall at the end of the active region.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing transistor of semiconductor device, the method comprising the steps of:
   (a) forming a trench type device isolation film defining a I-type active region on a semiconductor substrate having a stacked structure of a pad oxide film, a pad nitride film thereon;
   (b) etching a predetermined thickness of the device isolation film to form a silicon fin extruding above the device isolation film;
   (c) tilt implanting an impurity on a sidewall of the silicon fin to form a channel region;
   (d) forming a gate oxide film on the sidewall of the silicon fin;
   (e) forming a planarized polysilicon layer for gate electrode on the semiconductor substrate;
   (f) patterning the polysilicon layer and the pad nitride film to form a gate electrode;
   (g) forming a lower insulating film including a landing plug contact hole exposing a portion of the pad oxide film and a portion of the gate oxide film;
   (h) performing an ion implant process to form an impurity implanted region at a bottom of the landing plug contact hole;
   (i) etching the exposed portion of the pad oxide film to expose the silicon fin; and
   (j) forming a landing plug filling the landing plug contact hole.

2. The method according to claim 1, wherein the step (a) comprises:
   forming the stacked structure of the pad oxide film and the pad nitride film on the semiconductor substrate;
   performing an exposure and development process using an exposure mask having a mask film pattern defining the I-type active region spaced apart from a region where the gate electrode is to be formed to form a photoresist film pattern on the semiconductor substrate;
   forming a trench by etching the stacked structure and the semiconductor substrate using the photoresist film pattern as an etching mask; and forming the trench type device isolation film by filling the trench.

3. The method according to claim 1, wherein the step (a) comprises:
forming the stacked structure of the pad oxide film and the pad nitride film on the semiconductor substrate;
forming a CVD oxide film on the pad nitride film;
etching the CVD oxide film via a photolithography process using a device isolation film mask to form a CVD oxide film pattern;
wet etching the surface of the CVD oxide film pattern;
forming a trench by etching the pad nitride film, the pad oxide film and the semiconductor substrate using the wet-etched CVD oxide film pattern as an etching mask; and
forming the trench type device isolation film by filling the trench.

4. The method according to claim 1, wherein the step (a) comprises:
forming the stacked structure of the pad oxide film and the pad nitride film on the semiconductor substrate;
etching the pad nitride film via a photolithography process using a device isolation film mask to form a pad nitride film pattern;
wet etching the surface of the pad nitride film pattern;
forming a trench by etching the pad oxide film and the semiconductor substrate using pad nitride film pattern as an etching mask; and
forming the trench type device isolation film by filling the trench.

5. The method according to claim 2, wherein the trench formation process further comprises forming a thermal oxide film and a liner nitride film on the surface of the trench.

6. The method according to claim 1, wherein the tilt implanting process of the step (c) is performed at an impurity concentration ranging from $10E10$ to $10E19/cm^3$.

7. The method according to claim 1, wherein the gate oxide film has a thickness ranging from 50 to 100 Å.

8. The method according to claim 1, wherein the step (h) comprises:
forming a LDD region by ion-implanting an impurity for LDD at the bottom of the landing plug contact hole; and
forming a halo impurity region by ion-implanting a halo impurity.

9. The method according to claim 1, wherein the method comprises diffusing an impurity included the landing plug into the silicon fin to form a source/drain region.

10. The method according to claim 1, wherein the gate electrode further comprises a stacked structure of a barrier metal layer, a metal layer, a hard mask nitride film and a hard mask oxide film.

11. The method according to claim 1, wherein the step (g) comprises:
forming a nitride film for spacer on the semiconductor substrate;
forming a planarized insulating film on the nitride film for spacer; and
performing a SAC process to form a nitride spacer and the landing plug contact hole.

12. The method according to claim 11, wherein the SAC process comprises an over-etch process for removing the pad nitride film and the nitride film for spacer on the gate oxide film.

13. The method according to claim 1, wherein the pad oxide film has a thickness ranging from 50 to 200 Å.

14. The method according to claim 1, wherein the pad nitride film has a thickness ranging from 100 to 400 Å.

15. The method according to claim 3, wherein the trench formation process further comprises forming a thermal oxide film and a liner nitride film on the surface of the trench.

16. The method according to claim 4, wherein the trench formation process further comprises forming a thermal oxide film and a liner nitride film on the surface of the trench.

* * * * *